United States Patent
Dijkmans et al.

(10) Patent No.: US 6,300,825 B1
(45) Date of Patent: Oct. 9, 2001

(54) PWM AMPLIFIER WITH FEEDBACK LOOP INTEGRATOR

(75) Inventors: Eise C. Dijkmans; Johannes A. T. M. Van Den Homberg, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/235,364

(22) Filed: Jan. 21, 1999

(30) Foreign Application Priority Data

Jan. 22, 1998 (EP) .................................................. 98200162

(51) Int. Cl.⁷ ...................................................... H03F 3/38
(52) U.S. Cl. ........................ 330/10; 330/207 A; 330/251; 381/121
(58) Field of Search .................................. 330/10, 207 A, 330/251; 381/121

(56) References Cited

U.S. PATENT DOCUMENTS

| | | | |
|---|---|---|---|
| 4,458,208 | 7/1984 | Abe | 330/10 |
| 4,504,793 | 3/1985 | Yokoyama et al. | 330/10 |
| 5,805,020 | * 9/1998 | Danz et al. | 330/10 |

OTHER PUBLICATIONS

Holt "Electronic Circuits" John Wiley & Sons New York 1978 p. 806.*

* cited by examiner

*Primary Examiner*—Michael B Shingleton
(74) *Attorney, Agent, or Firm*—Bernard Franzblau

(57) ABSTRACT

A PWM amplifier comprising a comparator and an integrator is known to amplify, for example, audio signals. One drawback of the known PWM amplifiers is the maximally achievable loop gain is low. To overcome the disadvantages of the prior art PWM amplifiers, a PWM amplifier is provided with a second integrator in the feedback loop.

5 Claims, 2 Drawing Sheets

PWM AMPLIFIER WITH FEEDBACK LOOP INTEGRATOR

BACKGROUND OF THE INVENTION

This invention relates to a PWM (pulse width modulation) amplifier.

A PWM amplifier, also referred to as a class-D amplifier, may be used, for example, for amplifying audio signals.

A PWM amplifier of this type is known from U.S. Pat. No. 4,504,793.

This patent describes such an amplifier which comprises an integrator and a comparator.

A drawback of this circuit is that, due to stability requirements, the maximally achievable loop gain is rather low, for example, 40 dB at 1 kHz input signal and 330 kHz switching frequency. Consequently, the distortion numbers and the PSRR (power supply reaction ratio) are not very satisfactory. Moreover, the oscillator is directly coupled to the input of the circuit and the noise in the audio band produced by this oscillator will be added to the input signal. To achieve a large dynamic range, an oscillator producing minimal noise must be used. This configuration is used in, for example, the Sony TA-N88 audio power amplifier.

A further drawback of this circuit is that the switching frequency depends on the input signal.

It is, inter alia, an object of the invention to provide a PWM amplifier which does not have the above-mentioned drawbacks. A first aspect of the invention provides a PWM amplifier as defined in claim 1.

A PWM amplifier in which the distortion of the output stage as well as the noise contribution of the oscillator are reduced is realized by applying a higher-order integration in the feedback loop.

In accordance with a second aspect of the invention, a PWM amplifier has the characteristic features defined in claim 2.

A third, fourth and fifth aspect of the invention provides a receiver, a multimedia apparatus and an information reading apparatus as defined in claims 3, 4 and 5, respectively.

BRIEF DESCRIPTION OF THE DRAWING

These and other aspects of the invention will become apparent from and will be elucidated with reference to the embodiments described hereinafter.

In the drawing.

DESCRIPTION OF THE PREFERRED EMBODIMENTS

Figure 1A:
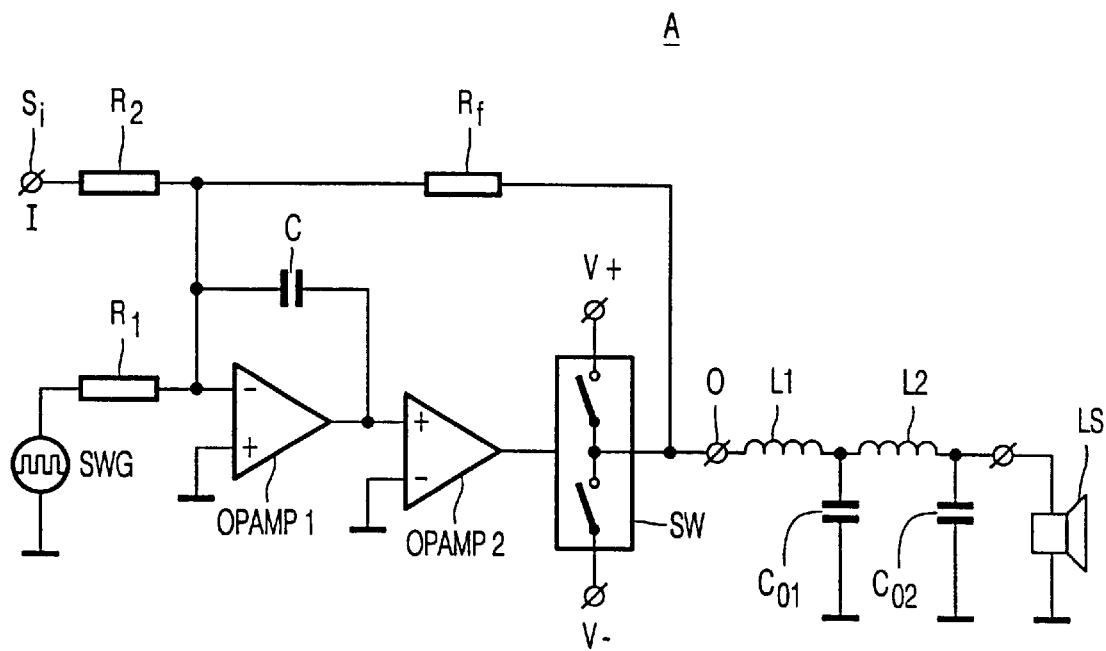
FIG. 1 shows two embodiments of a PWM amplifier in accordance with the prior art.

FIG. 1a shows a known circuit diagram for a class-D amplifier A. The first operational amplifier OPAMP1 is arranged as an integrator with a capacitor C and an adder with resistors R1 and R2, and the second operational amplifier OPAMP2 is arranged as a comparator. A triangular voltage is generated at the output of the integrator $OPAMP_1$ by means of the square-wave generator SWG at the input via a resistor R1. The input signal Si is superimposed on this triangular voltage via a resistor R2, and this composite signal is compared with ground. A PWM signal then appears at the output of the comparator OPAMP2. This signal drives a set of power switches SW which must supply the power at the output O. From these switches, a feedback resistor R1 is coupled to the input with which the gain of the assembly can be fixed. The output is coupled via a filter comprising inductances L1 and L2 and capacitances C01 and C02 to a loudspeaker LS.

Figure 1B:
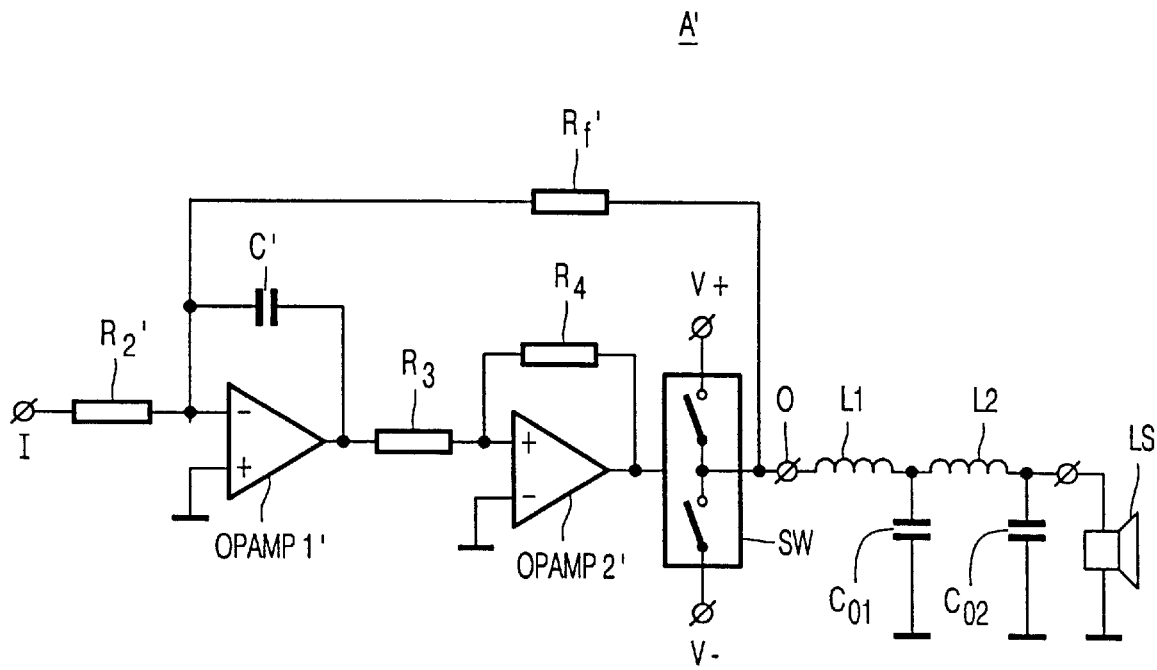

FIG. 1b also shows a known self-oscillating version of a class-D amplifier A'. In this set-up, the comparator OPAMP2' and resistors R3 and R4 have a hysteresis and the square-wave generator at the input may be dispensed with. A large dynamic range can thereby be achieved in a simpler manner.(FM modulation occurs.) The FM swing is rather large, and to keep the switching frequency within a given range, the maximum modulation depth must be limited.

The maximally achievable loop gain is equal to that of the standard configuration of FIG. 1a, so that, also in this case, the distortion numbers and the PSSR are not very satisfactory. Corresponding elements have corresponding reference numerals.

Figure 2:
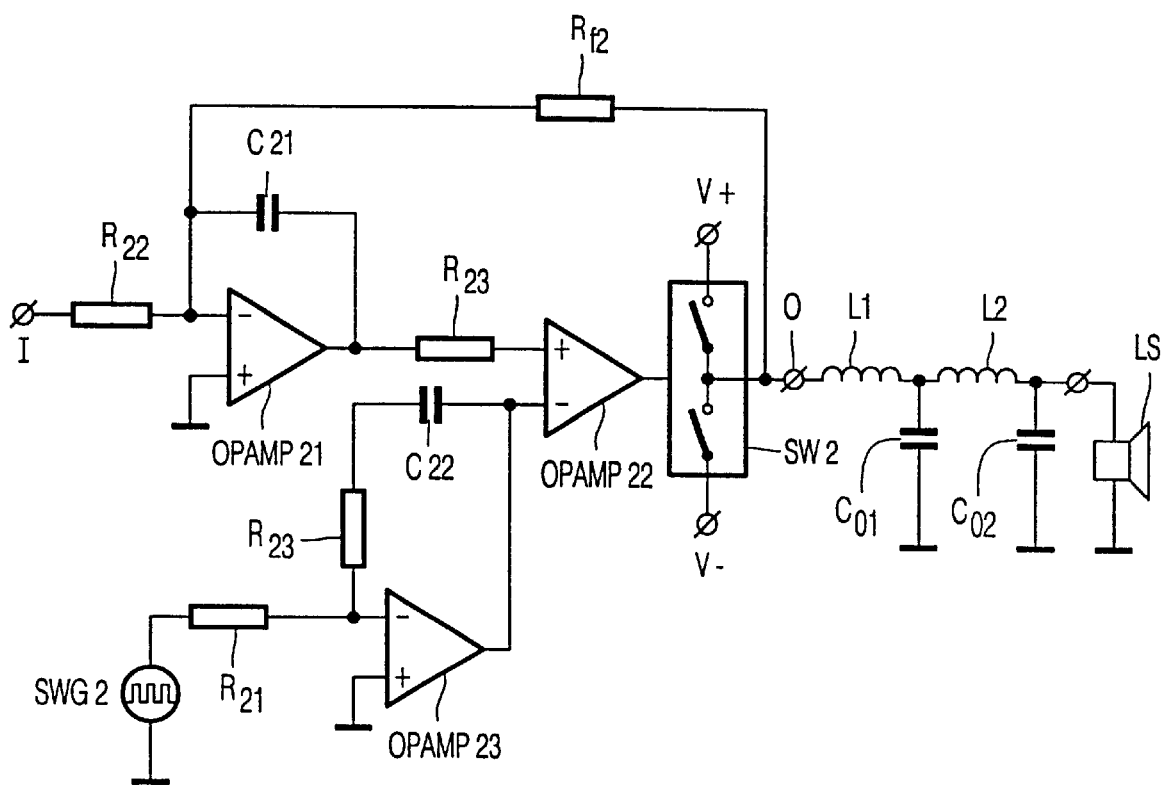
FIG. 2 shows an embodiment of a PWM amplifier in accordance with the invention.

FIG. 2 shows an embodiment of a PWM amplifier A2 according to the invention, in which the standard configuration of FIG. 1a is shown, but with an extension of the loop filter by an extra integrator in the form of an operational amplifier OPAMP23 and capacitance C22. In this way, more loop gain can be realized in the low part of the frequency spectrum. For example, at 1 kHz input signal and 330 kHz switching frequency, a loop gain of 76 dB can be achieved. This results in satisfactory distortion numbers and a satisfactory PSRR. The feedback loop includes only a passive circuit element, in this case a resistor $R_{f2}$.

The advantages of the invention can be achieved by adding the outputs of the first and second integrators and suitably choosing the integration time constants.

The order of the filter may of course be further increased but the gain per order then decreases. When using filters having an order which is higher than the first-order, instability should be prevented from occurring in the case of overdrive. This is realized by providing the extra integrators with an amplitude limiter circuit.

The square-wave generator SWG2 is coupled to the last integrator OPAMP22 so that the noise at the input I of the circuit A2, originating from the generator SWG2, is compensated by the gain of the previous integrators. The requirements of noise imposed on the generator will thereby be much less stringent.

Even when the standard configuration of FIG. 1b is extended by extra integrators, this leads to an increased loop gain in the audio band, with the associated better THD (total harmonic distortion) and PSRR (power supply reaction ratio), and creates the possibility of reducing the FM swing. A higher-order loop filter for both standard configurations is therefore a sensible extension.

It will be evident to those skilled in the art that a PWM amplifier according to the invention can be adapted at all kinds of subordinate points without departing from the scope of the invention.

A PWM amplifier according to the invention may also be used in, for example, an audio signal receiver, a multimedia apparatus and/or an information reading apparatus.

What is claimed is:

1. A PWM amplifier comprising:
    a first integrator and a comparator connected in cascade to a signal input terminal,
    a feedback loop coupled from an output of the comparator to an input of the first integrator, means coupling a second integrator to an input of the comparator, a pair of power switching devices coupled between an output of the comparator and an input of a filter, and the feedback loop includes only a passive impedance element coupled between an output of the power switching devices and an input of the first integrator.

2. A PWM amplifier comprising:

a first integrator and a comparator connected in cascade to a signal input terminal, a feedback loop coupled from an output of the comparator to an input of the first integrator, wherein said feedback loop includes only a passive impedance element, and means coupling a second integrator to an input of the comparator.

3. The PWM amplifier as claimed in claim 2 further comprising a square wave generator coupled to an input of the second integrator.

4. The PWM amplifier as claimed in claim 2 wherein the output of the second integrator is coupled to the input of the comparator only via passive circuit means.

5. The PWM amplifier as claimed in claim 2 wherein said coupling means includes only passive circuit means.

* * * * *